United States Patent
Jacksen et al.

(10) Patent No.: US 6,690,012 B1
(45) Date of Patent: Feb. 10, 2004

(54) HYBRIDIZED LEAD-SALT INFRARED RADIATION DETECTORS AND METHODS OF FORMATION

(75) Inventors: Niels F. Jacksen, Cave Creek, AZ (US); Jeffrey G. Tibbitt, Phoenix, AZ (US); Michael A. Sepulveda, Mesa, AZ (US)

(73) Assignee: Litton Systems, Inc., Woodland Hills, CA (US)

( * ) Notice: Subject to any disclaimer, the term of this patent is extended or adjusted under 35 U.S.C. 154(b) by 167 days.

(21) Appl. No.: 09/976,191

(22) Filed: Oct. 11, 2001

Related U.S. Application Data

(60) Provisional application No. 60/240,525, filed on Oct. 13, 2000.

(51) Int. Cl.$^7$ .............................................. H01L 21/00
(52) U.S. Cl. ................................. 250/338.1; 250/338.4
(58) Field of Search .......................... 250/338.1, 338.4, 250/332, 349, 370.08

(56) References Cited

U.S. PATENT DOCUMENTS

| | | | |
|---|---|---|---|
| 4,339,764 A | * 7/1982 | Schoolar | 257/441 |
| 4,472,239 A | 9/1984 | Johnson et al. | 156/647 |
| 4,478,076 A | 10/1984 | Bohrer | 73/204 |
| 4,478,077 A | 10/1984 | Bohrer et al. | 73/204 |
| 4,501,144 A | 2/1985 | Higashi et al. | 73/204 |
| 4,624,137 A | 11/1986 | Johnson et al. | 73/204 |
| 4,682,503 A | 7/1987 | Higashi et al. | 73/755 |
| 4,683,159 A | 7/1987 | Bohrer et al. | 428/138 |
| 4,696,188 A | 9/1987 | Higashi | 73/204 |
| 4,709,252 A | 11/1987 | Jhabvala et al. | 357/30 |
| 4,752,694 A | 6/1988 | Hegel, Jr. et al. | 250/578 |
| 4,806,761 A | 2/1989 | Carson et al. | 250/332 |
| 4,825,693 A | 5/1989 | Bohrer et al. | 73/204.25 |
| 4,867,842 A | 9/1989 | Bohrer et al. | 156/647 |
| 4,914,742 A | 4/1990 | Higashi et al. | 357/26 |
| 4,956,686 A | 9/1990 | Borrello et al. | 357/30 |

(List continued on next page.)

OTHER PUBLICATIONS

U.S. patent appln. Ser. No. 09/976,723 filed Oct. 11, 2001, entitled "*Monolithic Lead–Salt Infrared Radiation Detectors and Methods of Formation*", inventors Niels F. Jacksen, et al, 27 pages of Specification, Abstract and Claims, and 5 pages of drawings.

Breen, Thomas, et al, "*More Applications of Uncooled Microbolometer Sensors*", Part of the SPIE Conference on Infrared Technology and Applications XXIV, San Diego, CA, SPIE vol. 3436, pp. 530–540, Jul. 1998.

Kreider, James F., et al, "*Multiplexed mid–wavelength IR long, linear photoconductive focal plane arrays*", SPIE vol. 1488 Infrared Imaging Systems: Design, Analysis, Modeling, and Testing II, pp. 376–388, 1991.

Radford, W., et al, "*Microbolometer Uncooled Infrared Camera with 20 mK NETD\**", Part of the SPIE Conference on Infrared Technology and Applications XXIV, San Diego, CA, SPIE vol. 3436, pp. 636–646, Jul. 1998.

Jhabvala, Murzban D., et al, "*A Monolithic Lead Sulfide–Silicon MOS Integrated–Circuit Structure*", IEEE Transactions on Electron Devices, vol. ED–29, No. 12, pp. 1900–1905, Dec. 1982.

*Primary Examiner*—Constantine Hannaher
*Assistant Examiner*—Otilia Gabor
(74) *Attorney, Agent, or Firm*—Baker Botts, L.L.P.

(57) ABSTRACT

A hybridized Lead-Salt infrared radiation detector includes a focal plane having a substrate and a sensitized, delineated Lead-Salt layer upon the substrate, the delineations forming a plurality of sections in a two-dimensional array. The detector also includes electrical contacts for each of the sections and a common grid between the sections. The detector further includes a layer of conductive barrier material on each electrical contact, a layer of passivating material on each section, and a layer of fusible conductive material on each layer of conductive barrier material.

33 Claims, 7 Drawing Sheets

U.S. PATENT DOCUMENTS

| | | | |
|---|---|---|---|
| 4,966,037 A | 10/1990 | Sumner et al. | 73/204.26 |
| 5,220,188 A | 6/1993 | Higashi et al. | 257/467 |
| 5,220,189 A | 6/1993 | Higashi et al. | 257/467 |
| 5,286,976 A | 2/1994 | Cole | 250/349 |
| 5,300,915 A | 4/1994 | Higashi et al. | 338/22 R |
| 5,420,419 A | 5/1995 | Wood | 250/338.4 |
| 5,450,053 A | 9/1995 | Wood | 338/18 |
| 5,534,111 A | 7/1996 | Hocker et al. | 216/15 |
| 5,561,295 A | 10/1996 | Jacksen et al. | 250/338.4 |
| 5,600,143 A * | 2/1997 | Roberts et al. | 250/349 |
| 5,665,959 A | 9/1997 | Fossum et al. | 250/208.1 |
| RE36,136 E | 3/1999 | Higashi et al. | 338/18 |
| 5,981,950 A | 11/1999 | Wolny et al. | 250/338.4 |
| 6,005,266 A | 12/1999 | Forrest et al. | 257/258 |
| 6,165,801 A * | 12/2000 | Burns et al. | 505/330 |
| 6,413,863 B1 * | 7/2002 | Liu et al. | 438/687 |
| 2002/0058352 A1 * | 5/2002 | Jacksen et al. | 438/54 |
| 2002/0079493 A1 * | 6/2002 | Morishita | 257/72 |

\* cited by examiner

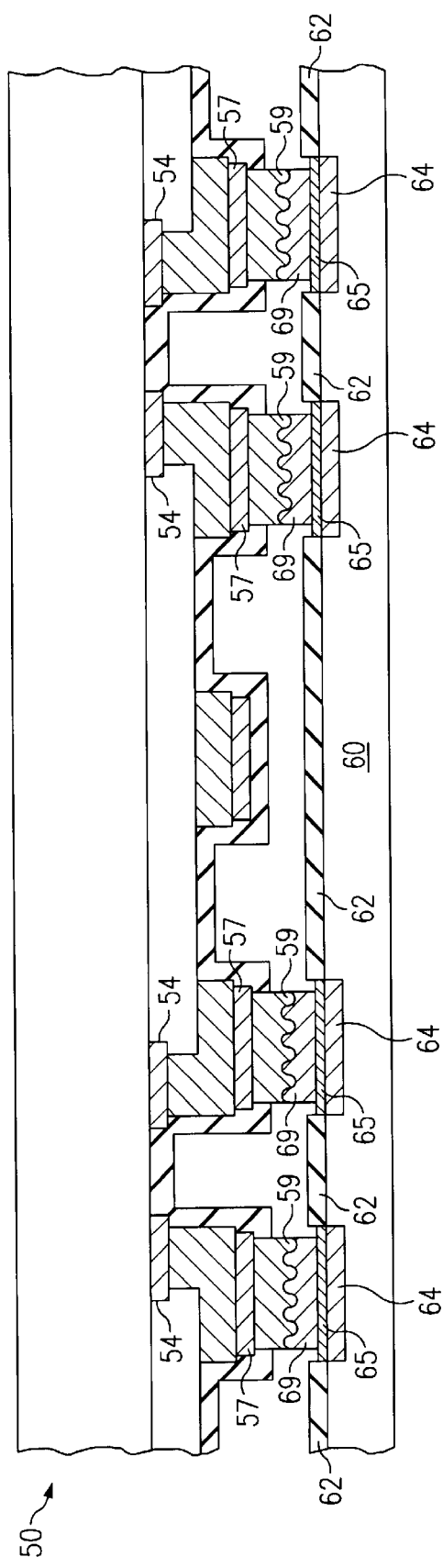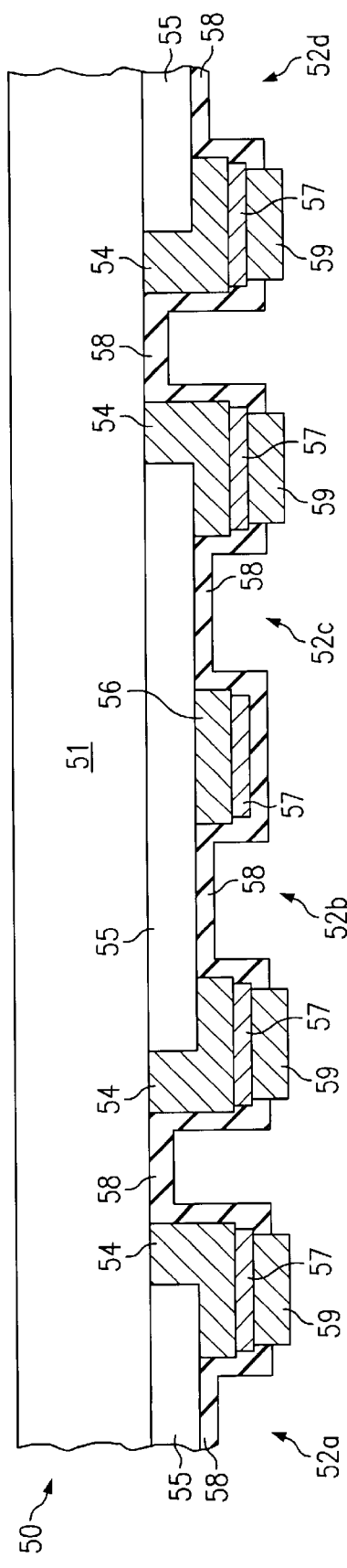

HYBRIDIZED LEAD-SALT INFRARED RADIATION DETECTORS AND METHODS OF FORMATION

RELATED APPLICATION

This application claims the benefit of U.S. Provisional Application Serial No. 60/240,525, filed Oct. 13, 2000, entitled 2D PbSalt Array.

TECHNICAL FIELD OF THE INVENTION

The invention relates to infrared radiation detectors and, more particularly, to Lead-Salt infrared radiation detectors their methods of formation.

BACKGROUND OF THE INVENTION

An infrared radiation detector responds to the thermal energy radiated by objects, such as animals, automobiles, and airplanes. This thermal energy is typically not visible to the human eye. Accordingly, by using an infrared radiation detector, objects that are not visible may be perceived and/or alternative views of visible objects may be obtained.

Infrared radiation detectors are typically composed of numerous detector elements, each of which detects a portion of a scene. The detector elements may be formed monolithically on an integrated circuit that processes the output from the detector elements or formed on their own substrate and then coupled to the integrated circuit. Monolithic architectures are advantageous because they require fewer processing steps and suffer fewer performance losses due to absorption. Hybrid architectures, on the other hand, are advantageous because detector materials that are incompatible with single crystal silicon may be utilized to form a focal plane array.

Currently, several high performance hybrid infrared radiation detectors exist. These detectors typically have detector elements made of Mercury-Cadmium-Telluride (HCT) or Indium Antimonide (InSb), which are expensive and difficult to process. Moreover, to function properly, these detectors require cryogenic cooling, which is expensive to design, complex to operate, and unreliable.

Additionally, there are two standard options for infrared radiation detectors that operate close to room temperature. In the eight to twelve micron band, microbolometer technologies are used. Unfortunately, these devices have a relatively long time constant—on the order of ten milliseconds. In the one to two micron band, Indium-Gallium-Arsenide (InGaAs) detector elements are used. Unfortunately, formation of these detectors requires complex Molecular Beam Epitaxy Deposition.

While other materials are known to exhibit acceptable photoconductive properties, creating hybrid detector elements may be difficult. For example, achieving an appropriate chemical reaction between the detector element material and the material on which the detector elements are to be formed may be difficult. Moreover, the surface on which the detector elements are to be formed may not have an appropriate geometry for the formation. Furthermore, achieving proper Ohmic contact between the detector elements and the integrated circuit may be difficult.

SUMMARY OF THE INVENTION

The present invention provides systems and methods that reduce and/or eliminate at least some of the disadvantages with the prior art. Accordingly, at least in certain embodiments, the present invention provides a hybridized, Lead-Salt infrared radiation detector that has good performance without requiring cryogenic cooling.

In certain embodiments, a hybridized Lead-Salt infrared radiation detector includes a focal plane array having a substrate and a sensitized, delineated Lead-Salt layer upon the substrate, the delineations forming a plurality of sections in a two-dimensional array. The detector also includes electrical contacts for each of the sections and a common grid between the sections. The detector further includes a layer of conductive barrier material on each electrical contact, a layer of passivating material on each section, and a layer of fusible conductive material on each layer of conductive barrier material.

In particular embodiments, a method for forming a hybridized Lead-Salt infrared radiation detector includes forming a focal plane array. Forming the focal plane array includes depositing a Lead-Salt layer upon a substrate, sensitizing the Lead-Salt layer, and delineating the Lead-Salt layer into a plurality of sections, the sections forming a two-dimensional array. Forming the focal plane array also includes forming electrical contacts for each of the sections and a common grid between the sections and depositing a layer of conductive barrier material on each electrical contact. Forming the focal plane array further includes depositing a layer of passivating material on each section and depositing a layer of fusible conductive material on each layer of conductive barrier material.

The present invention has several technical features. For example, the invention allows short wavelength infrared (SWIR) and medium wavelength infrared (MWIR) detectors to be readily manufactured. As another example, in certain embodiments, the detector elements can operate at or close to room temperature. Accordingly, the detectors can avoid the cost and complexity of cryogenic cooling. As a further example, in particular embodiments, the detector elements exhibit time constants on the order of one to ten microseconds, allowing a high frame rate, which may be useful for tracking applications where the scene varies rapidly. As still a further example, in some embodiments, the detector elements may have a relatively small pitch, such as, for example, less than approximately thirty microns. Having a smaller pitch allows for more densely populated detector elements on a given integrated circuit, which increases resolution, or for reducing the size of the integrated circuit for a given focal plane array format, which reduces the cost of the integrated circuit and the complexity of the optics. As another example, in certain embodiments, the processing of the Lead-Salt layer allows increased detectivity of the detector elements. Of course, some embodiments may contain one, some, or all of these technical features.

Other technical features will be readily apparent to those skilled in the art from the following figures, written description, and claims.

BRIEF DESCRIPTION OF THE DRAWINGS

The drawings described below provide a more detailed understanding of the present invention, especially when considered in light of the following written description, and of its technical features:

FIG. 3 illustrates the focal plane array of FIG. 2 hybridized with one embodiment of a read-out integrated circuit for the system in FIG. 1;

FIG. 6 provides a detailed cross-sectional view of another embodiment of a focal plane array for the system in FIG. 1;

DETAILED DESCRIPTION OF EMBODIMENTS OF THE INVENTION

Figure 1:
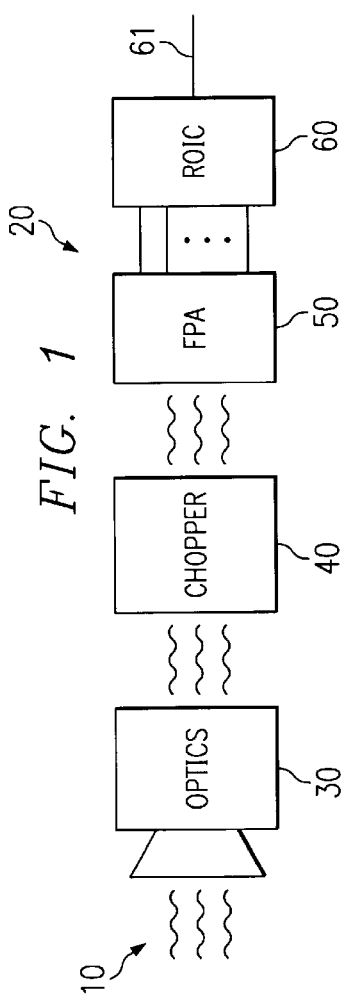
FIG. 1 illustrates an infrared radiation detection system in accordance with one embodiment of the present invention.

FIG. 1 illustrates an infrared radiation detection system 20 in accordance with one embodiment of the present invention. In general, system 20 receives infrared radiation 10 from a scene that is to be imaged and produces signals that represent the scene. The signals may be used to produce an image of the scene on a display, to perform object recognition, or any other appropriate task. As used herein, "infrared radiation" means any portion of the radiation emitted in the band between approximately seven-tenths of a micron and one-thousand microns.

As illustrated, system 20 includes optics 30, a chopper 40, a focal plane array (FPA) 50, and a read-out integrated circuit (ROIC) 60. Optics 30 gathers the infrared radiation 10 and directs it toward chopper 40. Chopper 40 alternately allows the infrared radiation gathered by optics 30 and the infrared radiation of a reference scene, the chopper itself in this embodiment, to impinge upon FPA 50. FPA 50, which is composed of a plurality of detector elements arranged in a two-dimensional array (not shown), detects the infrared radiation from the alternating actual scene and reference scene and produces signals representative of the infrared radiation in each scene. In general, the detector elements of FPA 50 may be composed of any type of material that changes resistance when infrared radiation impinges thereon. Thus, FPA 50 produces signals that vary in current as the impinging infrared radiation varies. ROIC 60, which is hybridized to FPA 50, detects the signals from FPA 50, processes them, and places the processed signals on a data link 61, so that they may be processed further, such as for image extraction or viewing on a display.

Because of the detector elements of FPA 50, system 20 operates as a photoconductive detection system. In operation, a bias voltage, which typically ranges from 0.1V to 10V, depending on the size of detector elements, is applied, possibly by ROIC 60 or an external bias source, to the detector elements. The bias current produced by the bias voltage may be on the order of a few hundred nanoAmps, while the photocurrent produced by the impinging infrared radiation may be on the order of a few hundred picoAmps. ROIC 60 then reads the current off each of the detector elements during the actual and reference scenes, the impinging radiation causing a change in current. For example, FPA 50 may have an array of 320 ×256 detector elements spaced on thirty micron centers, giving ROIC 60 over 87,000 detector elements to be accessed, although almost any other number of detector elements could be used. In particular embodiments, ROIC 60 may access some or all of the detector elements on a continuous basis. Upon receiving the signals, ROIC 60 subtracts the reference signals from the actual signals and amplifies, filters, gain adjusts, and multiplexes the signals on data link 61. ROIC 60 may also perform other functions, such as, for example, analog to digital conversion, detector element substitution, and/or automatic gain control.

The components of system 20 may have any of a variety of forms. For example, optics 30 may include a lens, a mirror, a polarizer, a beam splitter, and/or any other type of device for manipulating infrared radiation. As another example, chopper 40 may be a shutter, a rotating blade, or any other type of device for alternately allowing and not allowing infrared radiation 10 to impinge upon FPA 50. As a further example, ROIC 60 may be any type of semiconductive device that detects and processes signals from FPA 50. In particular embodiments, ROIC 60 is a silicon-based CMOS multiplexer. Data link 61 may be a bus, a fiber-optic cable, a cellular channel, or any other type or wireline or wireless link.

Figure 2:
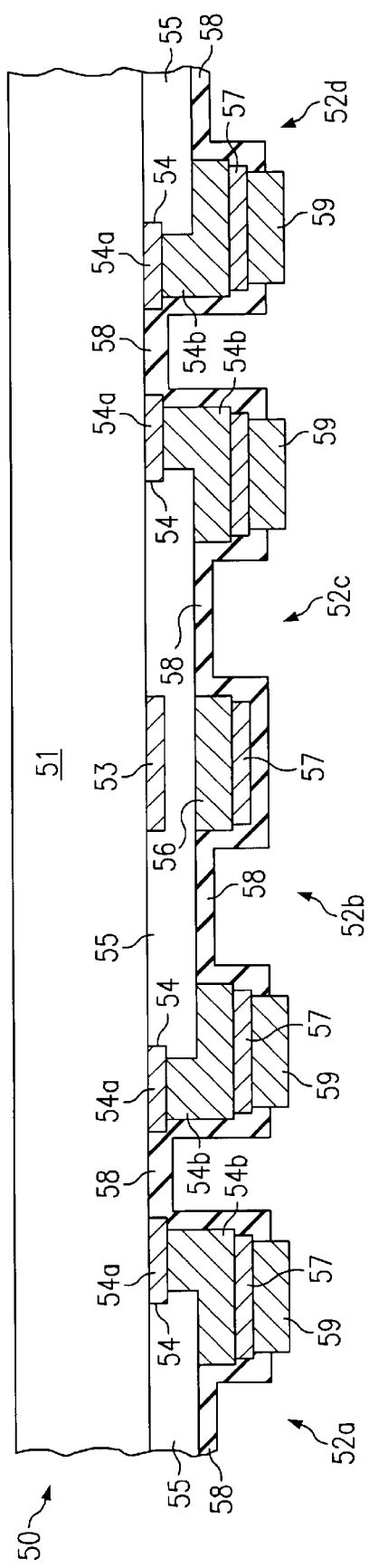
FIG. 2 provides a detailed cross-sectional view of one embodiment of a focal plane array for the system in FIG. 1.

FIG. 2 provides a detailed cross-sectional view of one embodiment of FPA 50. As can be seen, FPA 50 includes a plurality of detector elements 52, represented here by detector elements 52 $a$–$d$, formed on a substrate 51. In particular embodiments, detector elements 52 form a two-dimensional grid, each of detector elements 52 receiving infrared radiation from part of the scene to be imaged. Detector elements 52 include a common grid 53 formed upon substrate 51 to interconnect the detector elements. Thus, common grid 53 supplies a common signal to detector elements 52 during operation. Additionally, each of detector elements 52 includes an electrical contact 54, through which signals regarding the impinging infrared radiation are output. Electrical contacts 54 include a first portion 54$a$ and a second portion 54$b$, which is formed after first portion 54$a$.

As illustrated, electrical contacts 54 of detector elements 52$a$ and 52$c$ are cut in the cross-section while electrical contacts 54 of detector elements 52$b$ and 52$d$ are not. This results from the fact that electrical contacts 54 of detector elements 52$a$ and 52$c$ are forward of electrical contacts 54 of detector elements 52$b$ and 52$d$ in the illustration. Electrical contacts 54, therefore, are staggered, which allows for an increase in fill factor.

Each of detector elements 52 also includes a Lead-Salt layer 55. In the illustrated embodiment, the Lead-Salt layer 55 is sensitized and delineated into approximately sixteen micron by twenty-five micron sections, although other sizes could be used in other embodiments. Each of Lead-Salt layers 55 is formed after first portion 54$a$ of the associated electrical contact 54—so that first portion 54$a$ can underlay part of Lead-Salt layer 55—but before second portion 54$b$—so that second portion 54$b$ can overlay part of the Lead-Salt layer 55. In particular embodiments, however, second portions 54$b$ do not have to overlay part of Lead-Salt layers 55.

Also on Lead-Salt layers 55 is a second common grid 56 and a layer of passivation material 58. Like common grid 53, common grid 56 also interconnects detector elements 52 to supply a common signal during operation. Having first common grid 53 and second common grid 56 increases the probability of good Ohmic contact to the detector elements. Second common grid 56, however, may provide better Ohmic contact than common grid 53 since the latter is covered by Lead-Salt layers 55, although second common grid 56 is not required in all embodiments. Passivation layer 58 may prevent shorting to Lead-Salt layers 55 and shorting between detector element contacts 52.

Formed on electrical contacts 54 and second common grid 56 is a layer of conductive barrier material 57, and formed on each of conductive barrier layers 57 is a layer of fusible, conductive material 59. Conductive barrier layers 57 provides a buffer between electrical contacts 54 and fusible, conductive layers 59 so that they do not chemically react with each other while still allowing the flow of signals between them. Fusible, conductive layers 59 allows FPA 50 to be hybridized with ROIC 60. Note that passevation layer 58 also partially covers conductive barrier layers 58 and fusible, conductive layers 59, although it need not in other embodiments.

In operation, a potential is applied across common grid 53 and electrical contacts 54 so that a current flows into electrical contacts 54 even when no infrared radiation is impinging upon FPA 50. This current is commonly known as a bias current and flows through electrical contacts 54, conductive barrier layers 57, and fusible, conductive layers 59 to ROIC 60. Infrared radiation 10 arrives at the side of substrate 51 opposite detector elements 52. The infrared radiation then propagates through substrate 51 and impinges Lead-Salt layer 55. Because Lead-Salt layer 55 is photoconductive, it changes its resistance due to the impinging infrared radiation, which results in a change in current to ROIC 60. Then, ROIC 60 can perform its processing upon the signals.

In particular embodiments, a thermoelectric cooler (TEC) may be used to increase performance by stabilizing the temperature of the device and/or cooling it to approximately 250K. Further cooling to the limit of the TEC, approximately 180K, may further enhance performance.

The components of FPA 50 may be composed of a variety of materials. For example, Lead-Salt layer 55 may be composed of Lead-Selenide (PbSe), Lead-Sulfide (PbS), or any other type of photoconductive Lead-Salt material. Substrate 51 may be composed of any type of silica-based ceramic or glass through which infrared radiation can propagate. In embodiments where Lead-Salt layers 55 are composed of Lead-Selenide, substrate 51 is typically composed of Z-Quartz, although it may be composed of any other appropriate material that has a matched coefficient of thermal expansion (CTE). Having a matched CTE for Lead-Selenide is beneficial because it has a relatively high CTE (around $20 \times 10^{-6}$ in/in-° C.) and is usually sensitized at temperatures exceeding 400° C, which can result in large internal stress at the Lead-Selenide/substrate interface and, more importantly, in the Lead-Selenide layer itself. Reducing internal stress results in increased post-sensitization adhesion of the Lead-Selenide layer and performance of the detector elements. Common grid 53, electrical contacts 54, and second common grid 56 may be composed of Gold, Titanium-Gold, or any other appropriate conductive material. In particular embodiments, first portion 54a and second portion 54b of electrical contacts 54 are composed of different materials. Conductive barrier layers 57 may be composed of Palladium or any other type of conductive material that provides a chemical reaction buffer between electrical contacts 54 and fusible, conductive layers 59, which may react adversely with each other in some embodiments. In certain embodiments, however, conductive barrier layers 57 are not required. Passivation layer 58 may be composed of Arsenic Tri-Selenide ($As_2Se_3$) or any other type of passivating material that does not significantly degrade detector performance. Fusible, conductive layer 59 may be composed of Indium, Z-directional adhesives, conductive polymers, or any other type of conductive material that is fusible with another conductive material.

The components of FPA 50 may also have a variety of sizes. Substrate 51 may be between about fifty microns and five-hundred microns thick, although in particular embodiments it is thinned to between about one-hundred microns and two-hundred microns. Common grid 53 and first portion 54a of electrical contacts 54 may be between about one-half micron and two microns thick. Second portion 54b of electrical contacts 54 and second common grid 56 may be between about one-half micron and four microns thick. Lead-Salt layers 55 may be between about two microns and five microns thick. Conductive barrier layers 57 may be between about one-tenth of a micron and one micron thick, and passivation layer 58 may be between about one-third of a micron and ten microns thick. In particular embodiments, passivation layer 58 is approximately a Quarter Wave Optical Thickness layer. Fusible, conductive layers 59 may be between about three microns and seven microns in thickness and, in general, should be thick enough to provide a reliable electrical coupling to ROIC 60.

Although a specific geometry is shown for detector elements 52 in FIG. 2, it should be appreciated that, due to processing variations, the geometry of actual devices may vary. Furthermore, different embodiments may use different lengths, widths, and thicknesses for substrate 51, common grid 53, electrical contacts 54, Lead-Salt layers 55, second common grid 56, conductive barrier layers 57, passivation layer 58, and/or fusible, conductive layers 59, which could also alter the illustrated geometry.

FIG. 3 illustrates FPA 50 of FIG. 2 hybridized with one embodiment of ROIC 60. FPA 50 and ROIC 60 are "hybridized" because they do not share the same wafer. As illustrated, ROIC 60 includes a passivation layer 62 and electrical contacts 64, which correspond to electrical contacts 54 of FPA 50. Formed on each of electrical contacts 64 is a layer of conductive barrier material 65, and formed on each of conductive barrier layers 65 is a layer of fusible, conductive material 69. Conductive barrier layers 65 may be of similar composition and size as conductive barrier layers 57 of FPA 50 and may be formed by similar processes. Fusible, conductive layers 69 may be of similar composition and size as fusible, conductive layers 59 of FPA 50 and may be formed by similar processes. The hybridization of FPA 50 and ROIC 60 involves fusing fusible, conductive layers 59 and fusible, conductive layers 69 together. Fusing may involve compressing fusible, conductive layer 59 s with fusible, conductive layers 69, compressing the materials together in the presence of heat, or any other appropriate process. By hybridization, signals from FPA 50 may be passed to ROIC 60 for processing, as discussed earlier. The electronics for such processing are not shown.

The components of ROIC 60 may be composed of a variety of materials. For example, passivation layer 62 may be composed of Silicon Dioxide ($SiO_2$), Silicon Nitride ($Si_3N_4$), or any other suitable passivating material. As another example, electrical contacts 64 may be composed of Aluminum (Al), Gold (Au), or any other appropriate conductive material. As a further example, conductive barrier layer 65 may be composed of Palladium or any other type of conductive material that provides a chemical reaction buffer between electrical contacts 64 and fusible, conductive layers 69, which may react adversely with each other in some embodiments. In certain embodiments, however, conductive barrier layers 65 are not required. As still another example, fusible, conductive layers 69 may be composed of Indium, Z-directional adhesives, conductive polymers, or any other appropriate type of conductive material that is fusible with another conductive material.

Figure 4:
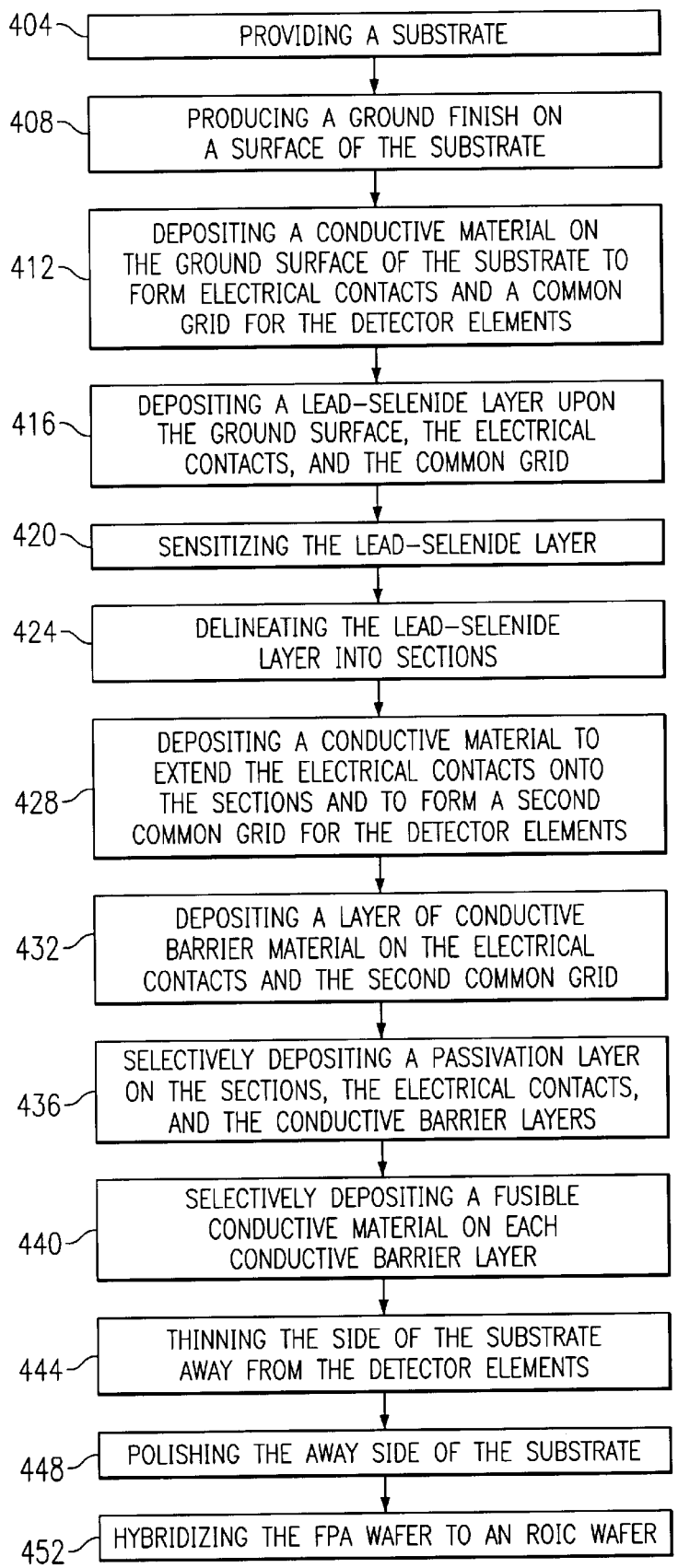
FIG. 4 is a flowchart illustrating one embodiment of a method for forming hybridized focal plane array and read-out integrated circuit similar to that illustrated by FIG. 3.

FIG. 4 is a flowchart 400 illustrating one embodiment of a method for forming a hybridized FPA/ROIC similar to that illustrated by FIG. 3. The method begins at function block 404 with providing a substrate. The method continues at function block 408 with producing a ground finish on a surface of the substrate. The ground finish may be produced by free abrasive lapping with Aluminum Oxide or other suitable material, by abrasive grit blasting using Aluminum Oxide or other suitable material, or by any other appropriate process. At function block 412, the method calls for depositing a conductive material on the ground surface of the substrate to form electrical contacts and a common grid for the detector elements. The conductive material may be deposited by Electron Beam Evaporation, Ion Beam Deposition, or any other appropriate process. In certain embodiments, the conductive material may be patterned to produce the electrical contacts and the common grid. Patterning can be accomplished by etch back photolithography, lift-off photolithography, or any other appropriate process.

At function block 416, the method calls for depositing a Lead-Selenide layer on the ground surface, the electrical contacts, and the common grid. The Lead-Selenide layer may be deposited by amorphous/polycrystalline chemical deposition using a precipitate method, which involves placing a wafer upside down in a heated solution of Lead Acetate and Selenourea, an aqueous precipitation growth process with a pH of between 6–7, Molecular Beam Epitaxy (MBE) or any other appropriate process.

The method continues with sensitizing the Lead-Selenide layer at function block 420 and delineating it into sections at function block 424. Sensitization may involve exposing the Lead-Selenide layer to Oxygen, Nitrogen, and/or Water Vapor at a relatively high temperature, such as, for example, greater than 400° C. for a period of between about two minutes and twenty minutes, or any other appropriate process. Delineation, which may reduce cross-talk between detector elements, may involve aligning the Lead-Selenide to the underlying metallization and chemical etching, ion beam etching, or any other appropriate process. In certain embodiments, surfactants, also known as wetting agents, are used in the Lead-Salt chemical etching solutions at 50° C. Use of surfactants, such as, for example, Triton X-100, results in a decrease in undercutting, which leads to higher fill factor and the ability to reduce pitch. In particular embodiments, the detector elements are separated by only about one micron.

At function block 428, the method calls for depositing a conductive material to extend the electrical contacts onto the sections and to form a second common grid for the detector elements. The conductive material may be deposited using thin film processes, lift-off metallization, or any other appropriate process. In particular embodiments, the conductive material may be deposited by lift-off technology using multiple layers of resists to achieve a thickness to account for or cover nodules of the Lead-Salt and/or reverse tapered reentrance profiles for the photoresist to reduce the material's tendency to stick to the sidewalls of the resist.

The method continues with depositing a layer of conductive barrier material on the electrical contacts and the second common grid at function block 432. The layer of conductive barrier material may be deposited by Electron Beam Evaporation, Ion Beam Deposition, or any other appropriate process.

At function block 436, the method calls for selectively depositing a layer of passivating material on the sections, the electrical contacts, and the conductive barrier layers. The passivation layer may be deposited using lift-off lithography, metal shadow mask techniques, or any other appropriate process. In particular embodiments, the passivation layer may be deposited by lift-off technology using multiple layers of resist to achieve a thickness to account for or cover nodules of the Lead-Salt and/or using reverse tapered reentrance profiles for the photoresist to reduce the material's tendency to stick to the sidewalls of the resist.

The method continues with selectively depositing a layer of fusible, conductive material on each conductive barrier layer at function block 440. The fusible, conductive material may be deposited using lift-off lithography or any other appropriate process. The fusible, conductive material may also be deposited onto connections for the common grids.

The method then continues with processing the substrate. At function block 444, the method calls for thinning the side of the substrate away from the detector elements, which reduces the absorption of infrared radiation by the substrate. Thinning may be accomplished by free abrasive lapping, diamond turning, or any other appropriate process. In embodiments where the substrate is composed of Z-Quartz, the substrate is preferably thinned to between approximately one-hundred microns and two-hundred microns. At function block 448, the method calls for polishing the away side of the substrate, which helps to minimize light scatter. Polishing may be accomplished using Cerium Oxide, Zirconium Oxide, or any other appropriate material.

The method then calls for hybridizing the ROIC wafer and the FPA wafer at function block 452. It is assumed here that the ROIC has already had a fusible, conductive material deposited on its electrical contacts, possibly by lift-off lithographic techniques. The hybridizing may be accomplished by pressing the fusible, conductive material of the ROIC wafer and the FPA wafer together. Typically, pressures between about one-tenth of a gram and two-tenths of a gram per detector element are required. Assuming the upper end of the pressures and an FPA of 320×256 detector elements, this translates to pressures over twenty kgram. In particular embodiments, heating the material to between approximately 50° C. and 100° C. may facilitate the fusing.

Although flowchart 400 illustrates several operations for constructing a hybrid FPA/ROIC in accordance with the present invention, other embodiments may possess more, less, and or a different arrangement of operations. For example, in certain embodiments, the conductive barrier material may not be required. As another example, if the FPA is formed on a substrate having multiple FPAs, the FPA may be diced after being formed but before being hybridized with the ROIC. As a further example, in some embodiments, the Lead-Selenide layer may be delineated before being sensitized. As still a further example, in particular embodiments, the passivation layer may be deposited after depositing the conductive barrier material and patterned simultaneously with the conductive barrier material. As another example, in some embodiments, Lead-Sulfide may be substituted for Lead-Selenide. As still another example, in some embodiments, second common grid is not required. As still a further example, in certain embodiments, after formation, the FPA 50 may be subjected to a heat treatment, such as, for example, being heated to between approximately 180° C. and 260° C. for between approximately four minutes and twenty minutes.

Figure 5:
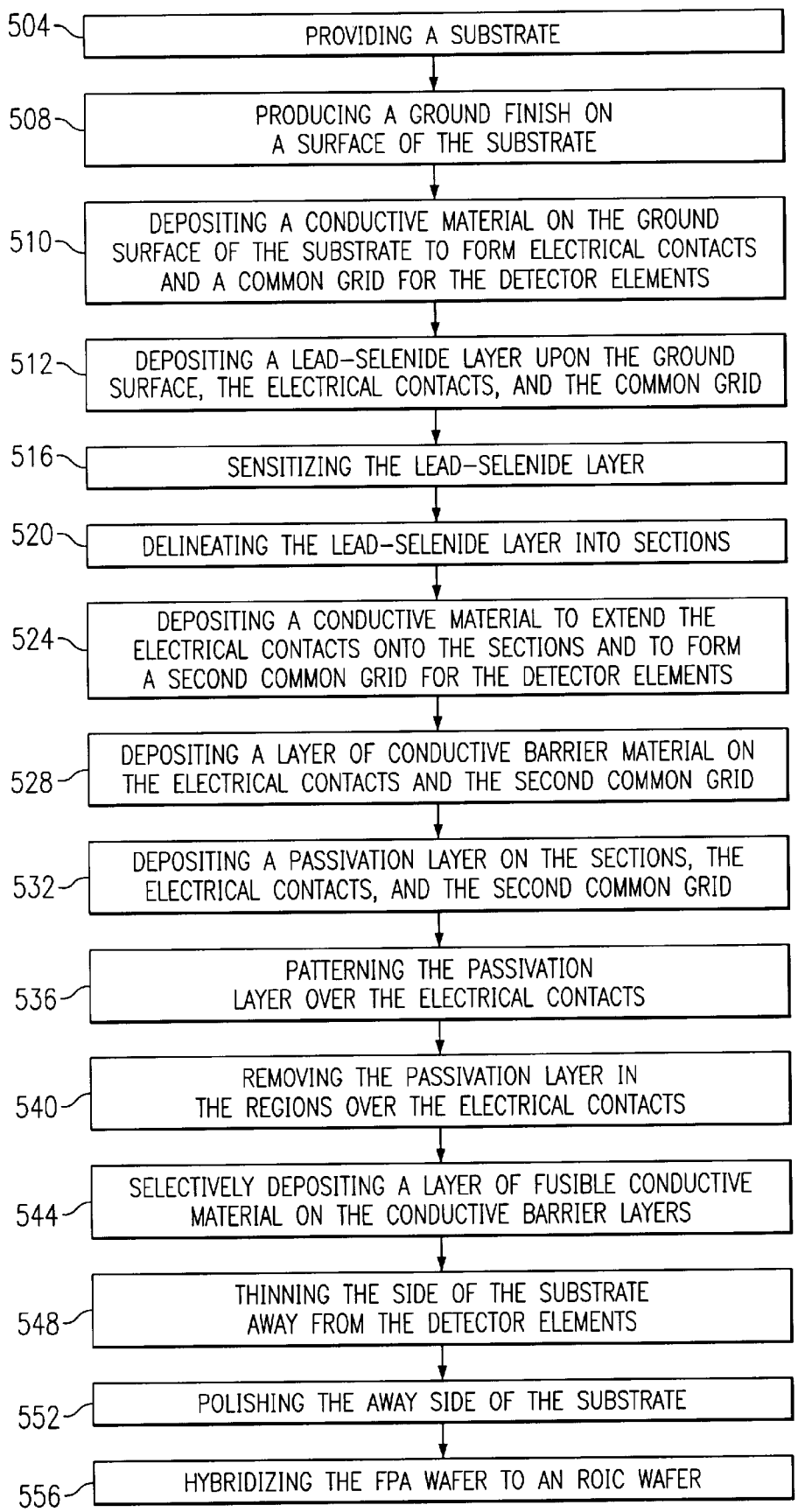
FIG. 5 is a flowchart illustrating one embodiment of a method for forming a hybridized focal plane array and read-out integrated circuit similar to that illustrated by FIG. 3.

FIG. 5 is a flowchart 500 illustrating one embodiment of a method for forming a hybridized FPA/ROIC similar to that illustrated by FIG. 3. In general, the operations are similar to those in flowchart 400. The method begins at function block 504 with providing a substrate. The method continues at function block 508 with producing a ground finish on a surface of the substrate. The method then calls for depositing a conductive material on the ground surface of the substrate to form electrical contacts and a common grid for the detector elements at function block 510. The method continues with depositing a Lead-Selenide layer upon the ground surface, the electrical contacts, and the common grid at function block 512, sensitizing the Lead-Selenide layer at function block 516, and delineating Lead-Selenide layer into sections at function block 520. At function block 524, the method calls for depositing a conductive material to extend the electrical contacts onto the sections and to form a second common grid for the detector elements. The method calls for depositing a conductive barrier material on the electrical contacts and the second common grid at function block 528. At function block 532, the method calls for depositing a layer of passivating material on the sections, the electrical contacts, and the second common grid. The passivating material may be deposited by thermal evaporation, Electron Beam Evaporation, or any other appropriate process. Then, the passivation layer is patterned in the regions of the electrical contacts at function block 536 and removed from the regions at function block 540. The passivation layer may be patterned by using a photoresist and removed by ion-milling, chemical etching, or any other appropriate process. Thus, the method illustrated by flowchart 500 may eliminate the need for a photolithographic masking process for the passivation layer, which may be used for the method illustrated by flowchart 400. The method continues at function block 544 with selectively depositing a layer of fusible, conductive material on the conductive barrier layers. The method calls for thinning the side of the substrate away from the detector elements at function block 548 and polishing it at function block 552. At function block 556, the method calls for hybridizing the FPA wafer with the ROIC wafer, assuming that the electrical contacts of the ROIC already have a fusible, conductive material formed upon them.

Although flowchart 500 illustrates several operations for forming a hybridized FPA/ROIC in accordance with the present invention, other embodiments may possess more, less, and or a different arrangement of operations. For example, the alternatives discussed for flowchart 400 may occur in certain embodiments. As another example, in some embodiments, the passivation layer may be removed and the contact metallization deposited in a single vacuum deposition cycle, possibly with multiple cycles, followed by the removal of the photoresist. The photoresist may be removed by the application of acetone or plasma or by any other appropriate process. In other embodiments, the fusible, conductive layer, instead of the contact metallization, may be deposited during the single vacuum deposition cycle.

FIG. 6 provides a detailed cross-sectional view of another embodiment of FPA 50. The embodiment of FPA 50 illustrated by FIG. 6 is similar to that illustrated by FIG. 2, in that the present embodiment includes a plurality of detector elements 52, represented again by detector elements 52a–d, upon a substrate 51, electrical contacts 54, Lead-Salt layers 55, common grid 56, conductive barrier layers 57, passivation layer 58, and fusible, conductive layers 59. Also as before, electrical contacts 54 of detector elements 52a and 52c are forward of the electrical contacts 54 of detector elements 52b and 52d in the illustration, resulting in the electrical contacts being staggered. In this embodiment, however, electrical contacts 54 do not extend underneath Lead-Salt layers 55, allowing electrical contacts 54 to be formed in one cycle. Additionally, there is no common grid underneath Lead-Salt layers 55.

The components for the current embodiment of FPA 50 may be composed of similar materials to the embodiment of FPA 50 illustrated by FIG. 3. Additionally, the components of the current embodiment may be similarly sized and formed as those of the other embodiment.

Figure 7:
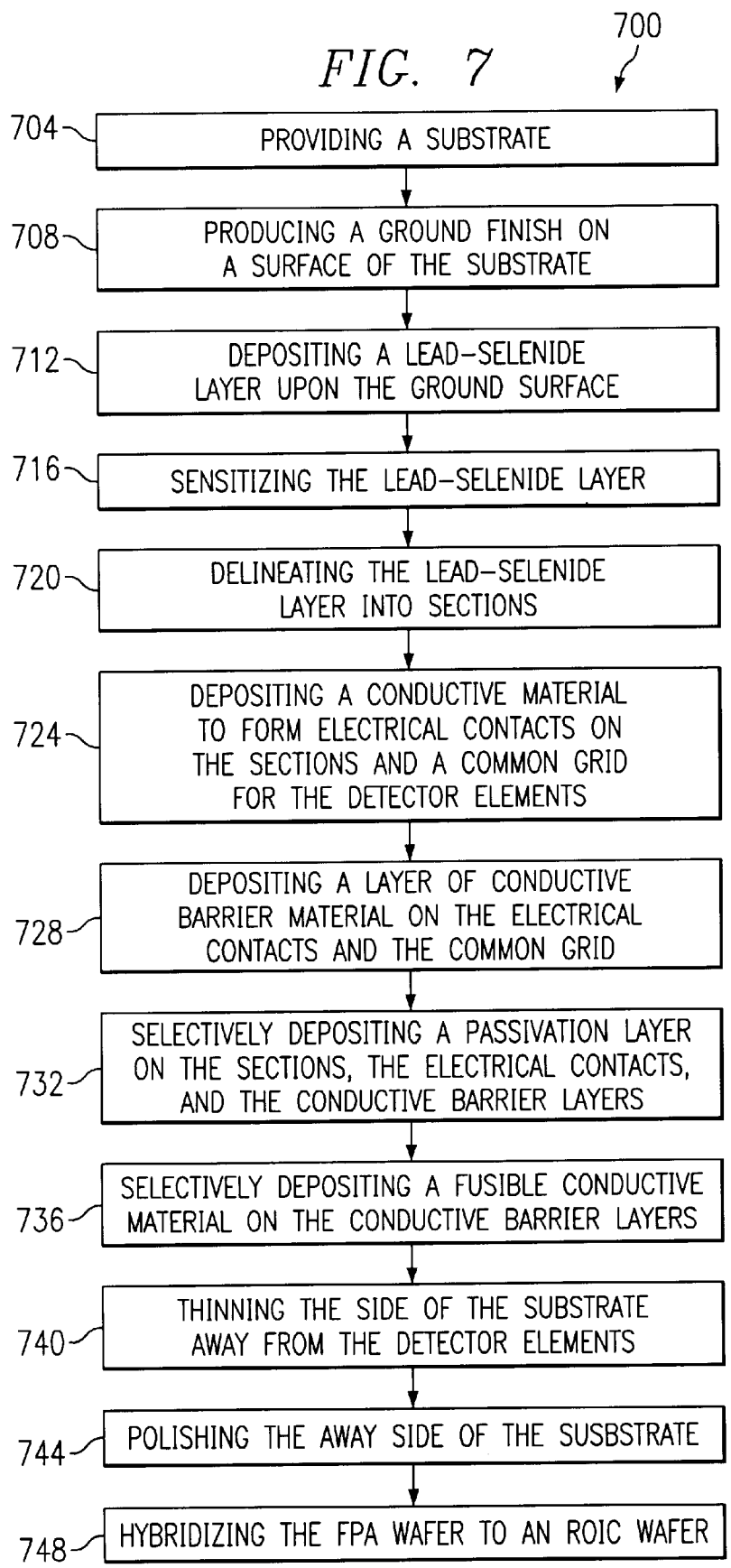
FIG. 7 is a flowchart illustrating one embodiment of a method for forming the focal plane array illustrated by FIG. 6.

FIG. 7 is a flowchart 700 illustrating one embodiment of a method for forming the focal plane array illustrated by FIG. 6. In general, the operations of flowchart 700 are similar to those in flowchart 400. The method begins at function block 704 with providing a substrate at function block 708. The method calls for producing a ground finish on a surface of the substrate. The method then continues with depositing a Lead-Selenide layer upon the ground surface of the substrate at function blocks 712. The method continues with sensitizing the Lead-Selenide layer at function block 716 and delineating the layer into sections at function block 720. At function block 724, the method calls for depositing a conductive material to form electrical contacts on the sections and a common grid for the detector elements. The method continues with depositing a conductive barrier layer on the electrical contacts and the common grid at function block 728 and selectively depositing a layer of passivating material on the sections, the electrical contacts, and the conductive barrier layers at function block 732. The method continues with selectively depositing a fusible, conductive material on the conductive barrier layers at function block 736 and thinning the side of the substrate away from the detector elements at function block 740. At function block 744, the method calls for polishing the away side of the substrate. The method continues with hybridizing the FPA wafer to the ROIC wafer at function block 740.

Although flowchart 700 illustrates several operations for forming a hybridized FPA/ROIC in accordance with the present invention, other embodiments may possess more, less, and/or a different arrangement of operations. For example, the alternatives discussed with respect to FIG. 4 may occur in certain embodiments. As another example, instead of being selectively deposited, the passivation layer may be deposited on the sections, the electrical contacts, and the common grid, patterned over the electrical contacts, and removed in the regions over the electrical contacts.

Figure 8:
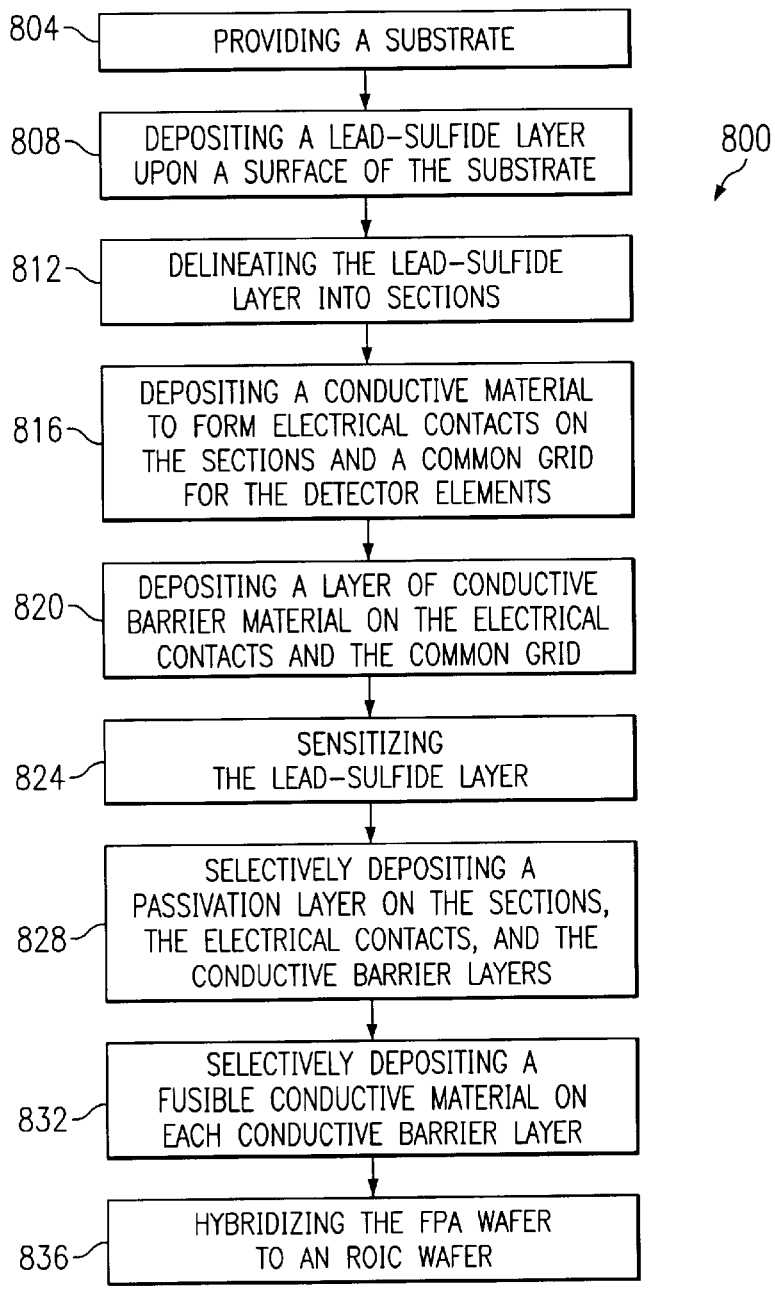
FIG. 8 is a flowchart illustrating one embodiment of a method for forming the focal plane array illustrated by FIG. 6.

FIG. 8 is a flowchart 800 illustrating one embodiment of a method for forming FPA 50 illustrated by FIG. 6. In general, the operations of flowchart 700 are similar to those in flowchart 700. The method begins at function block 804 with providing a substrate. At function block 808, the method calls for depositing a Lead-Sulfide layer upon a surface of the substrate. The Lead-Sulfide layer may be deposited by aqueous precipitation growth process using a pH of over thirteen, by MBE, or by any other appropriate process. In particular embodiments, multiple layers, such as, for example, two to five, of Lead-Sulfide may need to be deposited. The method continues with delineating the Lead-Sulfide layer into sections at function block 812. Delineation, which may reduce cross-talk between detector elements, may involve chemical etching, ion beam etching, or any other appropriate process. In certain embodiments, surfactants are used in the Lead-Salt chemical etching solutions at 25° C. At function block 816, the method calls for depositing a conductive material to form electrical contacts on the sections and a common grid for the detector elements. The method continues with depositing a conductive barrier layer on the electrical contacts and the common grid at function block 820 and sensitizing the Lead-Sulfide layer at function block 824, which may increase the detectivity of the detector elements to be formed of the Lead-Sulfide. Sensitization may involve heating the device to between about 100° C. and 120° C. in an open-air oven for between about five hours and one-hundred hours or any other appropriate process. The method then calls for selectively depositing a layer of passivating material on the sections, the electrical contacts, and the conductive barrier layers at function block 828 and selectively depositing a fusible, conductive material on the conductive barrier layers at function block 832. The method continues with hybridizing the FPA wafer to the ROIC wafer at function block 836.

Although flowchart 800 illustrates several operations for forming a hybrid FPA/ROIC in accordance with the present invention, other embodiments may include more, less, and or a different arrangement of operations. For example, in particular embodiments, the side of the substrate away from the detector elements is thinned and polished after the deposition of the fusible, conductive material. As another example, in some embodiments, the sensitization of the Lead-Sulfide layer may be performed earlier. As a further example, in certain embodiments, the Lead-Sulfide is replaced with Lead-Selenide. Other examples include those discussed for flowchart 700.

Figure 9:
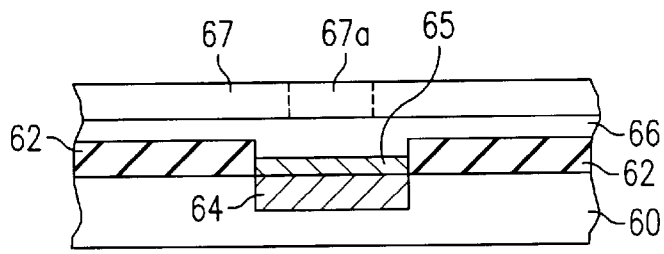
FIG. 9 illustrates a read-out integrated circuit at one stage of formation in accordance with one embodiment of the present invention.
Figure 10:
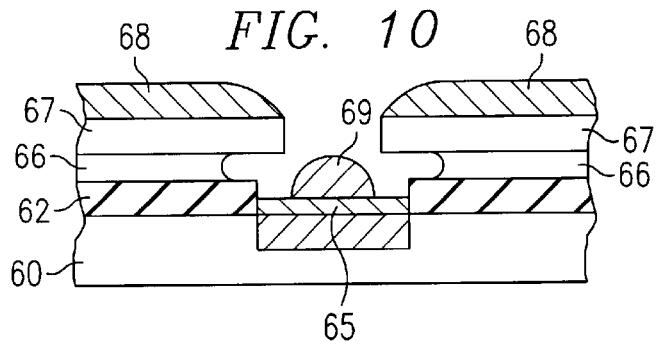
FIG. 10 illustrates the read-out integrated circuit at a second stage of formation in accordance with the embodiment.

FIGS. 9 and 10 illustrate ROIC 60 at different stages of formation in accordance with one embodiment of the present invention. Beginning with FIG. 9, as before, ROIC 60 includes passivation layer 62, electrical contacts 64 (only one of which is shown), and conductive barrier layers 65 (only one of which is shown). Formed on passivation layer 62 and conductive barrier layers 65 is a first layer of photoresist 66 that has been exposed. Formed on first photoresist layer 66 is a second layer of photoresist 67. Second photoresist layer 67 has been patterned at portions 67a, which are above electrical contacts 64.

Turning to FIG. 10, first photoresist layer 66 and second photoresist layer 67 of ROIC 60 have been developed. Accordingly, portions of the photoresist layers that were exposed previously have been removed. In addition, formed on second photoresist layer 67 is a layer of fusible, conductive material 68. Due to the development of photoresist layers 66 and 67, part of the fusible, conductive material 68 has formed on each of conductive barrier layers 65, making a fusible, conductive layers 69. Fusible, conductive layers 59 may be between approximately two microns and ten microns in thickness. Before hybridization, first photoresist layer 66 and second photoresist layer 67 may be removed, which will also remove fusible, conductive layer 68.

Figure 11:
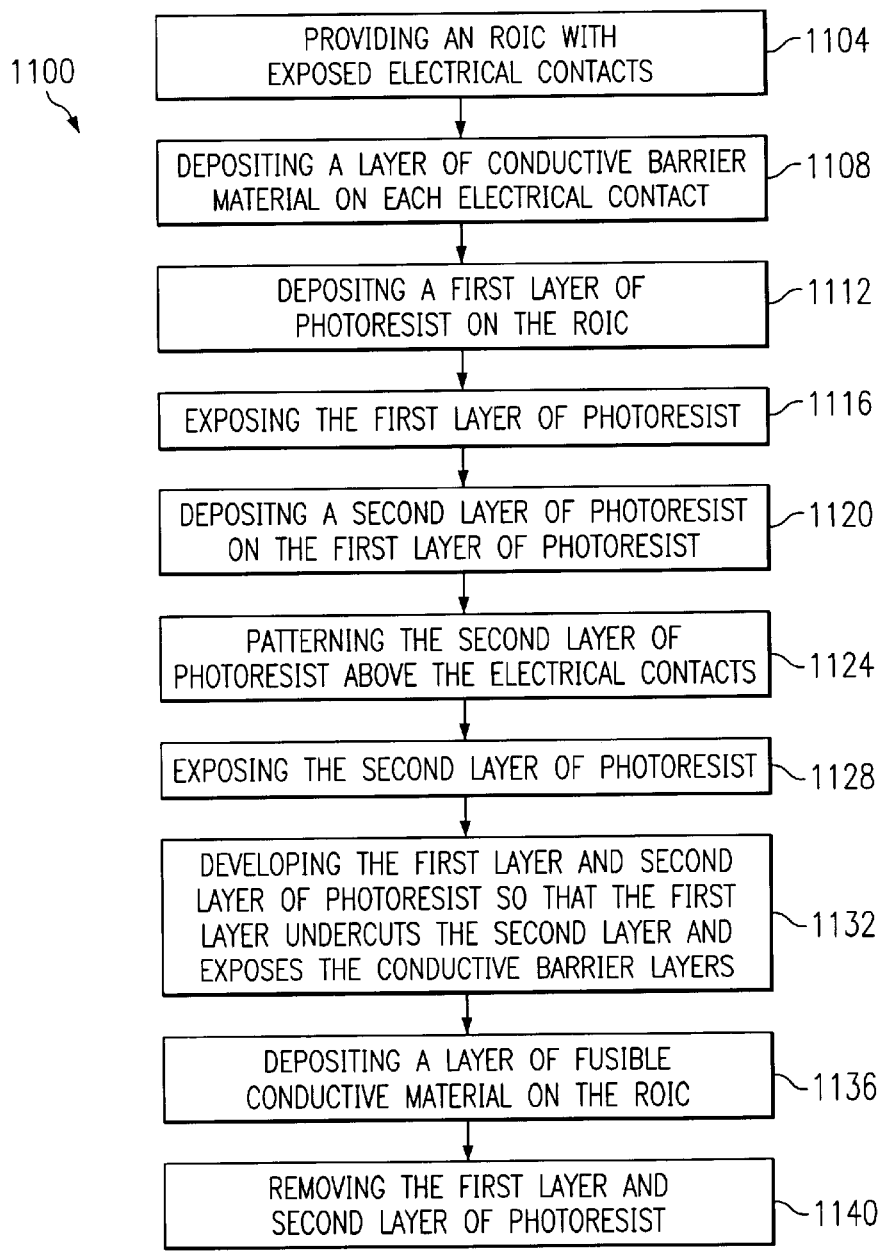
FIG. 11 is a flowchart illustrating one embodiment of a method for forming a read-out integrated circuit in accordance with the present invention.

FIG. 11 is a flowchart illustrating one embodiment of a method for forming a read-out integrated circuit in accordance with the present invention. The method begins at function block 1104 with providing an ROIC with exposed electrical contacts. The ROIC may be obtained from a foundry with the electrical contacts exposed or with the passivation layer intact, in which case the passivation layer would have to be removed, by reactive ion etching, ion beam machining, or any other appropriate process. The method continues at functional block 1108 with depositing a conductive barrier material on each electrical contact. The conductive barrier material may be deposited by Electron Beam Evaporation, Ion Beam Deposition, or any other appropriate process. The method then calls for depositing a first layer of photoresist on the ROIC at function block 1112 and exposing the first layer of photoresist at function block 1116. Next, the method calls for depositing a second layer of photoresist on the first layer of photoresist at function block 1120 and patterning the second layer of photoresist above the electrical contacts at function block 1124. The method continues at function block 1128 with exposing the second layer of photoresist. The first layer and second layer of photoresist may be deposited, patterned, and exposed by any of a variety of techniques well known to those skilled in the art. At function block 1132, the method calls for developing the first layer and second layer of photoresist so that the first layer undercuts the second layer and exposes the conductive barrier layers. This may be accomplished by applying a basic solution to the ROIC for a few minutes, depending on the size of the photoresist layers. The method continues with depositing a fusible, conductive material on the ROIC at function block 1136 and removing the first layer and second layer of photoresist at function block 1140. The fusible, conductive material may be deposited by evaporation or any of a variety of other techniques well known to those skilled in the art and removed by applying a solvent, such as, for example, acetone, to the ROIC. Note that the removal of the photoresist layers will also remove the fusible, conductive material on the photoresist layers while leaving the fusible, conductive material on the conductive barrier layers.

Although flowchart 1100 illustrates a variety of operations for forming an ROIC, other embodiments of the invention may have less, more, and/or a different arrangement of operations. For example, particular embodiments may include ion milling to remove remnants of the first photoresist layer that remain in the region of the conductive barrier layers after developing of the first photoresist layer. As another example, in particular embodiments, the conductive barrier layer is not required and, thus, is not deposited. As a further example, in some embodiments, the region of the first photoresist layer may be patterned above the regions of the electrical contacts before exposing the first photoresist layer.

The embodiments discussed above possess several technical features. For example, in some embodiments, the detector elements are especially useful in the short wavelength infrared (SWIR) band (approximately one to three microns), and, in other embodiments, the detector elements are especially useful in the medium wavelength infrared (MWIR) band (approximately three to five microns). Thus, SWIR detectors and MWIR detectors may be readily manufactured. As another example, the detector elements can operate at or close to room temperature. Accordingly, the detectors can avoid the cost and complexity of cryogenic cooling. As a further example, in some embodiments, the detector elements have a relatively high resistance, on the order of one to ten megaOhms, resulting in reduced power dissipation. Accordingly, cooling and power concerns for FPA 50 are reduced. As still a further example, in particular embodiments, the detector elements exhibit time constants on the order of one to ten microseconds, allowing a high frame rate, which may be useful for tracking applications. As still another example, the electrical contact patterns allow an acceptable fill factor to be obtained while maintaining good Ohmic contact. Moreover, with the electrical contact patterns, higher fill factors, over seventy percent, are probably obtainable, which would increase the efficiency of the detector, although shrinking the electrical contacts may result in problems in maintaining good Ohmic contact. Furthermore, the electrical contacts may be staggered, which will also allow an increase in fill factor. As an additional example, in certain embodiments, the detector elements 52 may have a relatively small pitch, such as, for example, approximately twenty microns, which allows for higher resolution and/or smaller arrays. As another example, in some embodiments, the processing of the Lead-Salt layer, such as, for example, by sensitization, etching with surfactants, using ion beam machining, and/or heat treatments, allows increased detectivity of the detector elements, on the order of $$D_{pk}^* \approx 5e^{10} \frac{cm\sqrt{Hz}}{w}$$

at ambient temperatures for particular embodiments of Lead-Selenide and $$D_{pk}^* \approx 5e^{11} \frac{cm\sqrt{Hz}}{w}$$

at ambient temperatures for particular embodiments of Lead-Sulfide.

While the invention has been discussed with respect to system 20, the invention is useful in other infrared radiation detection systems. These systems may or may not include optics 30 and/or chopper 40 and may or may not process signals from the FPA in a similar manner. Additionally, these systems may include additional components, such as displays, feature extractors, and/or digital signal processors. Accordingly, FPA 50 and ROIC 60 form an infrared radiation detector to which a variety of other components may be added.

Although a variety of embodiments have been discussed for the present invention, a variety of additions, deletions, substitutions, and/or modifications will be readily suggested to those skilled in the art. Accordingly, the following claims are intended to encompass those additions, deletions, substitutions, and/or modifications.

What is claimed is:

1. A method for forming a hybridized Lead-Salt infrared radiation detector, the method comprising:
    forming a focal plane array, comprising:
        depositing a Lead-Salt layer upon a substrate,
        sensitizing the Lead-Salt layer,
        delineating the Lead-Salt layer into a plurality of sections, the sections forming a two-dimensional array,
        forming electrical contacts for each of the sections and a common grid between the sections,
        depositing a layer of conductive barrier material on each electrical contact,
        depositing a layer of passivating material on each section, and
        depositing a layer of fusible conductive material on each layer of conductive barrier materials;
    depositing a layer of fusible conductive material on the electrical contacts of an integrated circuit; and
    fusing the integrated circuit to the focal plane array.

2. The method of claim 1, wherein the Lead-Salt layer comprises Lead-Selenide.

3. The method of claim 1, wherein the electrical contacts and the common grid comprise Gold.

4. The method of claim 1, wherein the conductive barrier material comprises Palladium.

5. The method of claim 1, wherein the fusible conductive material comprises Indium.

6. The method of claim 1, wherein the passivation layer comprises Arsenic Tri-Selenide.

7. The method of claim 1, wherein the electrical contacts overlay at least part of the sections.

8. The method of claim 1, wherein the electrical contacts underlay at least part of the sections.

9. The method of claim 1, wherein the electrical contacts overlay and underlay at least part of the sections.

10. The method of claim 1, wherein depositing a passivation layer on each section comprises:
    depositing the layer on the sections, the electrical contacts, and the conductive barrier layers;
    patterning the layer over the electrical contacts; and
    removing the patterned portions.

11. The method of claim 1, wherein the substrate comprises Z-Quartz.

12. The method of claim 1, further comprising producing a ground finish on the surface of the substrate where the Lead-Salt layer is to be deposited.

13. The method of claim 1, further comprising:
    thinning the side of the substrate away from the Lead-Salt layer; and
    polishing that side of the substrate.

14. The method of claim 1, wherein fusing the integrated circuit to the focal plane array comprises:
    aligning the fusible conductive layers of the integrated circuit with the fusible conductive layers of the array; and
    compressing the fusible conductive layers of the integrated circuit with the fusible conductive layers of the array.

15. The method of claim 1, wherein depositing a layer of fusible conductive material on the electrical contacts of an integrated circuit comprises:
    providing an integrated circuit with exposed electrical contacts;
    depositing a first layer of photoresist on the integrated circuit;
    exposing the first layer of photoresist;
    depositing a second layer of photoresist on the first layer of photoresist;
    patterning the second layer of photoresist above the electrical contacts;
    exposing the second layer of photoresist;
    developing the first layer of photoresist and the second layer of photoresist so that the first layer undercuts the second layer and exposes the conductive barrier layers;
    depositing a fusible conductive material on the integrated circuit; and
    removing the first layer and second layer of photoresist.

16. The detector of claim 1, wherein the integrated circuit comprises a layer of conductive barrier material between each electrical contact and fusible conductive layer.

17. A hybridized Lead-Salt infrared radiation detector, the detector comprising:
    a focal plane array, comprising:
        a substrate,
        a sensitized, delineated Lead-Salt layer upon the substrate, the delineations forming a plurality of sections in a two-dimensional array,
        electrical contacts for each of the sections,
        a common grid between the sections,
        a layer of conductive barrier material on each electrical contact, a layer of passivating material on each section, and
a layer of fusible conductive material on each layer of conductive barrier material; and
a layer of fusible conductive material on the electrical contacts of an integrated circuit, wherein the integrated circuit is fused to the array by fusing the fusible conductive layers of the integrated circuit with the fusible conductive layers of the array.

18. The detector of claim 17, wherein the electrical contacts and the common grid comprise Gold.

19. The detector of claim 17, wherein the conductive barrier material comprises Palladium.

20. The detector of claim 17, wherein the passivation layer comprises Arsenic Tri-Selenide.

21. The detector of claim 17, wherein the fusible conductive material comprises Indium.

22. The detector of claim 17, wherein the electrical contacts overlay at least part of the sections.

23. The detector of claim 17, wherein the electrical contacts underlay at least part of the sections.

24. The detector of claim 17, wherein the electrical contacts overlay and underlay at least part of the sections.

25. The detector of claim 17, wherein the Lead-Salt layer comprises Lead-Selenide.

26. The detector of claim 17, wherein the substrate comprises a ground finish on the surface where the Lead-Salt layer is to be deposited.

27. The detector of claim 17, wherein the substrate comprises Z-Quartz.

28. The detector of claim 27, wherein the side of the substrate opposite of the Lead-Salt layer is polished.

29. The detector of claim 17, wherein passivation layer overlays at least part of the electrical contacts and the conductive barrier layers.

30. A method for forming a hybridized Lead-Salt infrared radiation detector, the method comprising:
    forming a focal plane array, comprising:
        providing a Z-Quartz substrate,
        depositing a conductive material on the substrate to form electrical contacts for each of a plurality of detector elements and a common grid between the detector elements,
        depositing a Lead-Selenide layer upon the substrate, the electrical contacts, and the common grid,
        sensitizing the Lead-Selenide layer,
        delineating the Lead-Selenide layer into a plurality of sections, the sections forming a two-dimensional array,
        depositing additional conductive material to extend the electrical contacts onto the sections and to form a second common grid between the detector elements,
        depositing a layer of Palladium on each electrical contact,
        selectively depositing a layer of Arsenic Tri-Selenide on the sections and at least part of the electrical contacts and the layers of Palladium,
        depositing a layer of Indium on each layer of Palladium,
        thinning the side of the substrate away from the Lead-Selenide layer, and
        polishing the away side of the substrate;
    preparing an integrated circuit, comprising:
        providing an integrated circuit with exposed electrical contacts,
        depositing a layer of Palladium on each electrical contact,
        depositing a first layer of photoresist on the integrated circuit,
        exposing the first layer of photoresist,
        depositing a second layer of photoresist on the first layer of photoresist,
        patterning the second layer of photoresist above the electrical contacts,
        exposing the second layer of photoresist,
        developing the first layer of photoresist and the second layer of photoresist so that the first layer undercuts the second layer and exposes the layers of Palladium,
        depositing a layer of Indium on the integrated circuit, and
        removing the first layer and second layer of photoresist; and fusing the focal plane array to the integrated circuit.

31. A method for forming a hybridized Lead-Salt infrared radiation detector, the method comprising:
    forming a focal plane array, comprising:
        depositing a conductive material on a substrate to form electrical contacts for each of a plurality of detector elements and a common grid between the detector elements,
        depositing a Lead-Sulfide layer upon the substrate, the electrical contacts, and the common grid,
        delineating the Lead-Sulfide layer into a plurality of sections, the sections forming a two-dimensional array,
        depositing additional conductive material to extend the electrical contacts onto the sections and to form a second common grid between the detector elements,
        depositing a layer of Palladium on each electrical contact;
        sensitizing the Lead-Sulfide layer,
        depositing an Arsenic Tri-Selenide layer on the sections, the electrical contacts, and the layers of Palladium;
        patterning the Arsenic Tri-Selenide layer above the electrical contacts,
        removing the patterned portion by ion milling, and
        depositing a layer of Indium on each layer of Palladium;
    preparing an integrated circuit, comprising:
        providing an integrated circuit with exposed electrical contacts,
        depositing a layer of Palladium on each electrical contact,
        depositing a first layer of photoresist on the integrated circuit,
        exposing the first layer of photoresist,
        depositing a second layer of photoresist on the first layer of photoresist,
        patterning the second layer of photoresist above the electrical contacts,
        exposing the second layer of photoresist,
        developing the first of layer of photoresist and the second layer of photoresist so that the first layer undercuts the second layer and exposes the layers of Palladium,
        depositing a layer of Indium on the integrated circuit, and
        removing the first layer and second layer of photoresist; and fusing the integrated circuit to the focal plane array.

32. A hybridized Lead-Salt infrared radiation detector, the detector comprising:
    a focal plane array, comprising:
        a substrate comprising Z-Quartz, the substrate having a ground finish on a surface where detector elements are formed and a polished surface on the opposite surface, the substrate being less than two-hundred microns thick, a sensitized, delineated Lead-Selenide layer upon the polished surface of the substrate, the delineations forming a plurality of sections in a two-dimensional array, electrical contacts for each of the sections, the electrical contacts underlaying and overlaying at least part of each of the sections, a common grid that underlays the sections, a second common grid that overlays the sections, a layer of Palladium on each electrical contact, the layer providing a conductive chemical barrier between the electrical contacts and a future layer of Indium, a layer of Arsenic Tri-Selenide material on each section and at least part of the electrical contacts and the layers of Palladium, and a layer of Indium on each layer of Palladium, the layers providing fusible conductors; and an integrated circuit comprising:
  a plurality of electrical contacts,
  a layer of Palladium on the electrical contacts, and
  a layer of Indium on each layer of Palladium;

wherein the integrated circuit is fused to the focal plane array by having the Indium of the integrated circuit fused with the Indium of the array.

33. A hybridized Lead-Salt infrared radiation detector, the detector comprising:

a focal plane array, comprising:
  a substrate,
  a sensitized, delineated Lead-Sulfide layer upon the substrate, the delineations forming a plurality of sections in a two-dimensional array,
  electrical contacts for each of the sections, the electrical contacts underlaying and overlaying at least part of the sections,
  a common grid underlaying the sections,
  a second common grid overlaying the sections,
  a layer of Palladium on each electrical contact, the layer providing a conductive barrier between the electrical contacts and a future layer of Indium,
  a layer of Arsenic Tri-Selenide on each section and at least part of the electrical contacts and the layers of Palladium, and
  a layer of Indium on each layer of Palladium, the layers providing fusible conductors; and an integrated circuit comprising:
  a plurality of electrical contacts,
  a layer of Palladium on the electrical contacts, and
  a layer of Indium on each layer of Palladium;

wherein the integrated circuit is fused to the focal plane array by having the Indium of the integrated circuit fused with the Indium of the array.

* * * * *